United States Patent [19]

Philipossian et al.

[11] Patent Number: 5,316,965

[45] Date of Patent: May 31, 1994

[54] METHOD OF DECREASING THE FIELD OXIDE ETCH RATE IN ISOLATION TECHNOLOGY

[75] Inventors: Ara Philipossian, Redwood Shores, Calif.; Hamid R. Soleimani, Westborough; Brian S. Doyle, Framington, both of Mass.

[73] Assignee: Digital Equipment Corporation, Maynard, Mass.

[21] Appl. No.: 99,136

[22] Filed: Jul. 29, 1993

[51] Int. Cl.$^5$ .......................................... H01L 21/76
[52] U.S. Cl. ...................................... 437/70; 437/67; 437/61; 437/62; 437/63; 437/64; 437/69; 437/24; 437/25; 148/DIG. 50
[58] Field of Search .................. 437/72, 61, 62, 63, 437/64, 69, 70, 67, 24, 25; 148/DIG. 50

[56] References Cited

U.S. PATENT DOCUMENTS

| | | | |
|---|---|---|---|
| 4,420,872 | 12/1983 | Solo deZaldivar | 156/653 |
| 4,774,197 | 9/1988 | Haddad et al. | 437/24 |
| 4,892,614 | 1/1990 | Chapman et al. | 156/643 |
| 4,968,636 | 11/1990 | Sugawara | 437/61 |
| 5,006,482 | 4/1991 | Kerbaugh et al. | 437/67 |
| 5,077,234 | 12/1991 | Scoopo et al. | 437/67 |
| 5,130,268 | 7/1992 | Liou et al. | 437/67 |

FOREIGN PATENT DOCUMENTS

| | | | |
|---|---|---|---|
| 0114685 | 10/1978 | Japan | 437/70 |
| 0250646 | 10/1987 | Japan | 437/24 |

OTHER PUBLICATIONS

Daubenspeck et al., "Planarization of ULSI Topography Over Variable Pattern Densities," J. Electrochem. Soc. 138:506-509 (1991).

Davari et al., "A New Planarization Technique Using a Combination of RIE and Chemical Mechanical Polish (CMP)," IEDM Technical Digest, p. 1-3 (1990).

Sheldon et al., "Application of a Two-Layer Planarization Process to VLSI Intermetal Dielectric and Trench Isolation Processes," IEEE Transactions on Semiconductor Manufacturing 1:140-145 (1988).

Davari et al., "A Variable-Size Shallow Trench Isolation (STI) Technology with Diffused Sidewall Doping for Submicro CMOS," IEEE, pp. 92-95 (1988).

Schiltz et al., "Two-Layer Planarization Process," J. Electrochem. Soc. 133:178-181 (1986).

Shibata et al., "A Simplified Box (Buried-Oxide) Isolation Technology for Megabit Dynamic Memories," IEEE, pp. 27-30 (1983).

Josquin, "The Application of Nitrogen Ion Implantation in Silicon Technology," Nuclear Instruments and Methods 290/210:581-587 (1983).

Philipossian et al., "Kinetics of Oxide Growth During Reoxidation of Lightly Nitrided Oxides," J. Electrochem. Soc. 139:82-83 (1992).

"Low Temperature Shallow Trench Device Isolation of Semiconductor Material"; IBM Technical Disclosure Bulletin; vol. 32, No. 1, Jun. 1989, pp. 468-470.

*Primary Examiner*—Brian E. Hearn
*Assistant Examiner*—Trung Dang
*Attorney, Agent, or Firm*—Robert J. Feltovic; Denis G. Maloney; Albert P. Cefalo

[57] ABSTRACT

An improved process for planarizing an isolation barrier in the fabrication of a semiconductor chip involves reducing the etch rate of the field oxide independently of the sacrificial oxide layer. The field oxide layer is implanted with nitrogen ions and then thermally annealed resulting in a hardened and densified field oxide. In subsequent operations, a sacrificial oxide layer is formed on the semiconductor top surface by thermal oxidation. Upon etching with HF, the etch rate of the hardened field oxide is significantly reduced relative to untreated field oxide. Thus, the exposed hardened field oxide is etched at about the same rate as the sacrificial oxide layer. In the example given, the etch rate of untreated densified TEOS field oxide in 10:1 HF is 6.90 Å/sec, while the etch rate of TEOS field oxide hardened according to the processes of this invention is 5.90 Å/sec. After planarization using the hardened field oxide, depressions in the isolation barrier are eliminated.

23 Claims, 2 Drawing Sheets

METHOD OF DECREASING THE FIELD OXIDE ETCH RATE IN ISOLATION TECHNOLOGY

FIELD OF THE INVENTION

The present invention relates generally to manufacturing semiconductor devices, and more particularly to a method for controlling the field oxide etch rate in fabricating semiconductor substrates.

BACKGROUND OF THE INVENTION

Many electronic integrated circuits, also known as "chips," are formed by a strategic placement and interconnection of selected electronic devices, such as transistors and the like, within a semiconductor substrate. The electronic devices are interconnected using an array of surface conductors carrying data signals through which the devices communicate. The electronic devices, however, must be sufficiently isolated from one another so that the signals in each respective electronic device do not interfere with and degrade the others' signal quality.

In semiconductor applications requiring relatively close placement of electronic devices, isolation is commonly provided by forming a recess (or "trench"), depicted as 14 and 16 (FIG. 2) between two active areas (or "area mesas") 11 (FIG. 2), upon which the electronic devices are located, and filling the trench with isolation material, generally a silicon oxide. Thus, the filled trench (oftentimes referred to as field oxide) then provides isolation between the electronic devices and the surface conductors. By way of further background, U.S. Pat. No. 4,842,675 describes a method of forming thermal LOCOS field oxide in combination with trenches.

A major problem encountered in refining this recessing technique involves maintaining planarity of the trench material so that materials, such as printed conductors, can be readily applied thereon using conventional methods (using, for instance, lithography). A poorly planarized trench typically includes uneven areas along the top of the trench such as oxide depressions and/or spikes. In applications requiring signal-carrying conductors to be printed on the filled trench, a poorly planarized trench causes signal discontinuities and often degrades the performance of the entire chip.

There have been numerous attempts to improve trench planarity in the prior art, each has fallen short of providing a trench that is adequately planarized for certain applications. Such processes are described, for example, in the background sections, and in the detailed description sections, of U.S. Pat. Nos. 5,130,268 (Liou et al.); 5,077,234 (Scoopo et al.); 5,006,482 (Kerbaugh et al.); and 4,892,614 (Chapman et al.).

In shallow trench isolation processes or local oxidation of silicon (LOCOS) isolation techniques, the field oxide that forms the isolation barrier is generally a deposit of silicon oxide formed from silane, for example, low pressure chemical vapor deposition (LPCVD) of tetraethorthosilane (TEOS). Unfortunately, the chemically deposited silicon dioxide etches roughly eight times faster (or if densified, 20% faster) than conventional thermal oxide used to form the sacrificial oxide layers. Thus, field oxide loss in the trench or isolation barrier during subsequent etch treatments of the sacrificial oxide is a particularly difficult problem. Precise control of the etching process is required to reduce field oxide over etch during the multiple cleaning and oxide strips during the fabrication process.

Accordingly, there is a need for an improved process of fabricating an isolation trench or LOCOS field oxide, which overcomes the above-mentioned deficiencies.

SUMMARY OF THE INVENTION

The present invention provides a method to retard the oxide etch rate of field oxide layers in the fabrication of a semiconductor device. The method involves forming a first silicon dioxide layer on select locations of a silicon semiconductor surface. This is designated as the field oxide layer. Then nitrogen ions are implanted into the field oxide layer to form a partially nitrided silicon dioxide. After nitrogen implantation, the field oxide layer is thermally annealed to form a "hardened" nitrided field oxide layer. This "hardened" nitrided field oxide is more resistant to the etching effects of etchants such as HF than is untreated silicon oxide. After the hardened nitrided field oxide layer is formed, additional silicon dioxide layers can be formed by thermal oxidation on the surface of the silicon substrate. This thermal silicon dioxide layer is termed the "sacrificial" oxide layer. Thereafter, select portions of the sacrificial oxide layer can be removed by exposure to etchants. In the etching process, the hardened nitrided field oxide layer is more resistant to etching than untreated silicon dioxide; consequently, the etch rate of the hardened nitrided field oxide layer is retarded relative to its untreated precursor silicon dioxide.

The processes of this invention are applicable to the many techniques used to form field oxide barriers, including but not limited to LOCOS isolation and field trench isolation.

In one embodiment, the present invention provides an improved process for planarizing an isolation trench in the fabrication of a silicon semiconductor chip. The isolation trench, which can be wide, narrow or moderate width, typically has a top wall edge and a bottom and is adjacent to two sides having top surfaces thereon. The sidewalls surrounding the trench are generally composed of doped or undoped silicon. The planarization process includes depositing silicon oxide into the trench so as to fill the trench even with the top surfaces of the sides. Thereafter, the silicon dioxide filled trench is implanted with nitrogen ions, and the nitrided silicon dioxide is thermally annealed. Afterward, a thermal oxide layer is grown on the silicon top surfaces. This is the sacrificial oxide layer. In subsequent etching steps, the sacrificial oxide layer and a thin layer of the nitrided field oxide are etched back until the sacrificial oxide layer is removed from the top surfaces of the sides, and until the layer of nitrided field oxide remains even with the top wall edge of the trench. In this manner, the present invention provides an isolation trench process that minimizes the formation of depressions in the trench field oxide as a result of the etching process.

BRIEF DESCRIPTION OF THE DRAWINGS

The following detailed description, which sets forth other advantages of the present invention, refer to the accompanying drawings in which the elements have been given reference numerals. These drawings, which are not drawn to scale, are briefly described below.

DETAILED DESCRIPTION OF THE PREFERRED EMBODIMENTS

The method of this invention is described in the context of forming dielectric filled planar shallow isolation trenches of varying widths in a silicon substrate by way of example only. It will be apparent to one skilled in the art that the present invention is not limited to the specific embodiment of FIGS. 1-7, but it is equally adaptable to other substrate geometries having regions of a near constant height that are separated by varying lateral distances, such as for example LOCOS isolation. The undoped conductivity type for the silicon substrate 10 is by way of example only, as the present method is also applicable to other conductivity type substrates and wells, e.g., single well CMOS processes, and to other technologies including bipolar, n-channel and p-channel MOS and BiCMOS technologies. Such technologies may have their active devices formed directly into a monolithic substrate or into an epitaxial layer at the surface of a substrate.

Figure 1:
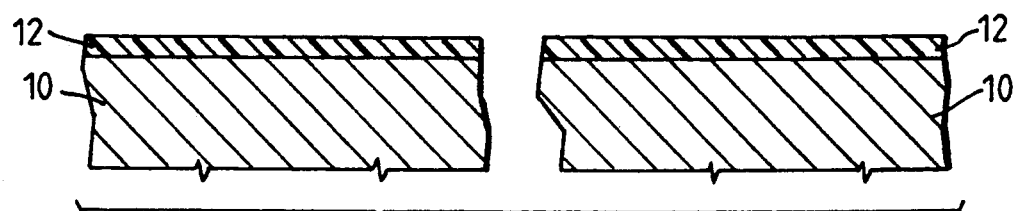
FIGS. 1 through 7 are diagrammatic cross-sectional views showing successive stages of processing of a semi-conductor having wide and narrow shallow trenches formed, filled with dielectric material and planarized according to this invention.

Referring now to the drawings, FIG. 1 shows a silicon semiconductor substrate 10 having an etch stop coating of silicon nitride ($Si_3N_4$) 12 deposited thereon. The silicon nitride is typically about 1000 Å thick and can be deposited by conventional means such as by chemical vapor deposition (CVD) from $SiH_2Cl_2+NH_3$ at 400 m Torr, at 770° C. The silicon nitride is then patterned by conventional photoresist techniques to reveal underlying openings where both wide and narrow trenches are to be formed.

Figure 2:
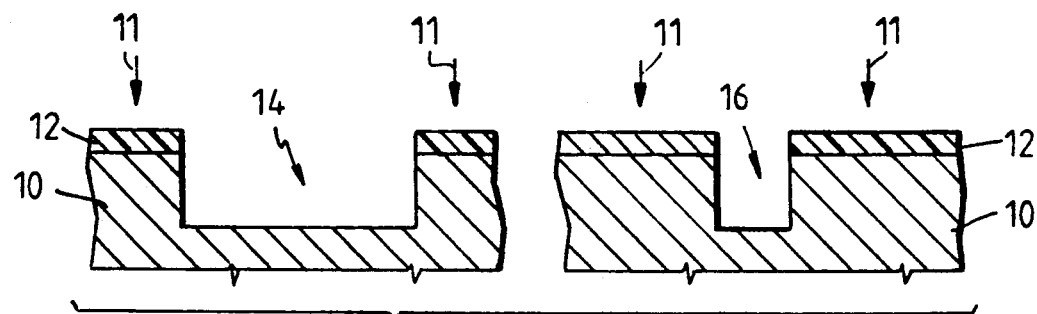

Two such trenches 14 and 16 are shown in FIG. 2 formed in substrate 10, although it is to be understood that normally many such trenches are formed. The trench 14 is a wide trench, typically wider than about one micron, and the trench 16 is a narrow trench, less than one micron wide and typically about 0.5 micron wide. These can be formed by conventional reactive ion etching (RIE) in a well known manner, such as, for example, in a plasma of $NF_3+Ar$ at 10 m Torr and 0.1-0.2 W/cm², utilizing the photoresist as a mask material which is a well known practice in the art. Other processes, also which are well known, may be used to form the trenches 14 and 16.

The present invention is especially useful for forming dielectric filled wide trenches; however, FIGS. 1 through 7 illustrate how the present invention can be used on substrates which contain narrow trenches as well as wide trenches.

Figure 3:
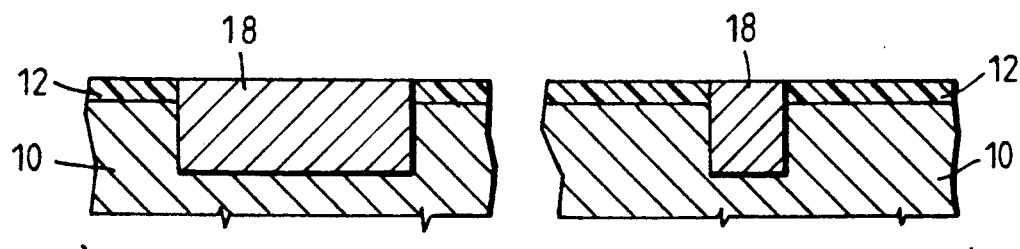

As shown in FIG. 3, a layer of silicon dioxide ($SiO_2$) 18 is formed in both the wide and narrow trenches 14 and 16. Preferably, the $SiO_2$ layer is deposited using well known CVD processes which typically include vapor deposition in tetraethylorthosilane (TEOS). Of course, other processes and a variety of silane or organo silane compounds could be used. The thickness of the CVD $SiO_2$ layer is approximately equal to the total depth of the trench so that the top of the $SiO_2$ layer in the trench 14 is approximately even with the top layer of the silicon nitride top surface 12. This is typically about 6000 Å in thickness, although this can vary greatly with different substrates, depending upon the utilization of the substrates for forming devices and the type of conductors which are to be formed on the substrate.

Figure 4:
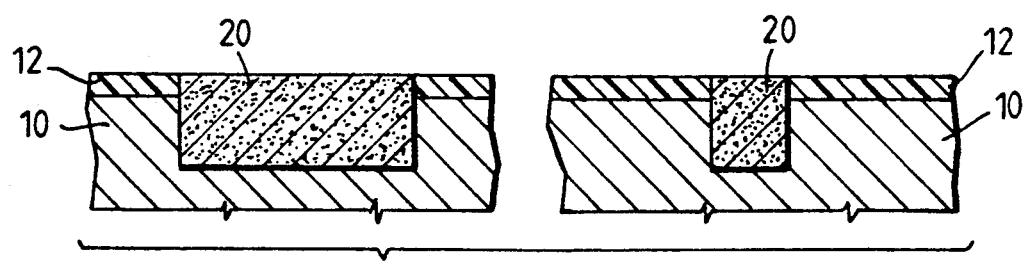

Now referring to FIG. 4, nitrogen ions ($N_2^+$) are implanted into the $SiO_2$ filled trench 20. Nitrogen ions are implanted in a dose of approximately $10^{14}$ ions per cm² at an energy of 100 keV. Of course, the dose of nitrogen ions can vary depending on the depth of the $SiO_2$ filled trench. In general, the nitrogen ion dosage can range between $10^{13}$ and $10^{15}$ ions per cm² and energy can range between 25 keV and 150 keV. Care should be taken that the nitrogen ions do not penetrate through to the silicon floor of the trench. As for the top surfaces of the sides, the thin layer of silicon nitride 12 protectively masks the underlying silicon 10 from nitrogen ion implantation. After nitrogen ion implantation is completed, the nitrided silicon dioxide layer is thermally annealed at 1050° C. for 30 minutes. Of course, the time and temperature can vary while providing substantially the same results, typically the thermal annealing step can be carried out between 800° and 1100° C. and for between about one minute and one hour. Thermal annealing promotes Si—N and Si—O—N bonding in the $N_2^+$ implanted silicon dioxide. Further, the combined nitrogen ion implantation and thermal annealing processes serve to densify the TEOS filled trench. Thus, the densification of deposited silicon dioxide often used in shallow trench isolation fabrication can be eliminated.

Figure 5:
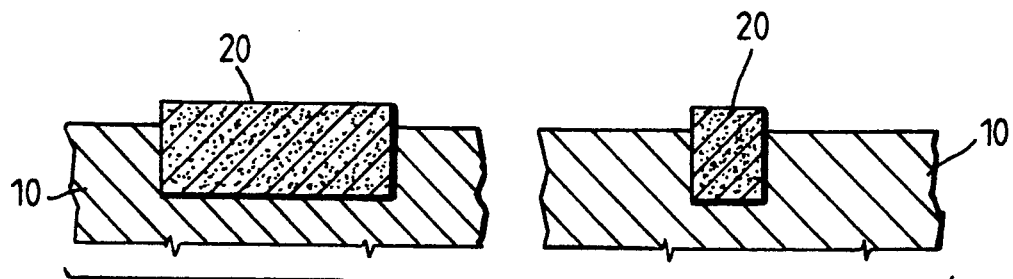
Figure 6:
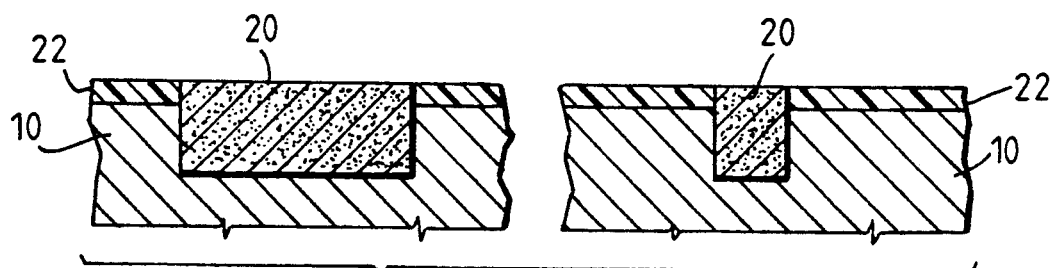

Now referring to FIG. 5, the layer of nitride is stripped from the top surfaces of the silicon 10. The nitride strip is accomplished by any number of conventional techniques, for example, plasma etching or hot phosphoric acid wash. The wet etch process with phosphoric acid attacks silicon nitride selectively, while removing very little of the nitrided field oxide. As can be seen in FIG. 5, a very thin layer of nitrided silicon dioxide 20 will extend beyond the silicon top surfaces 10. Following the removal of the nitride layer, the exposed top surfaces of the silicon substrate are thermally oxidized to form a layer of $SiO_2$ 22 about 15 nm thick. This is termed the sacrificial oxide layer.

Figure 7:
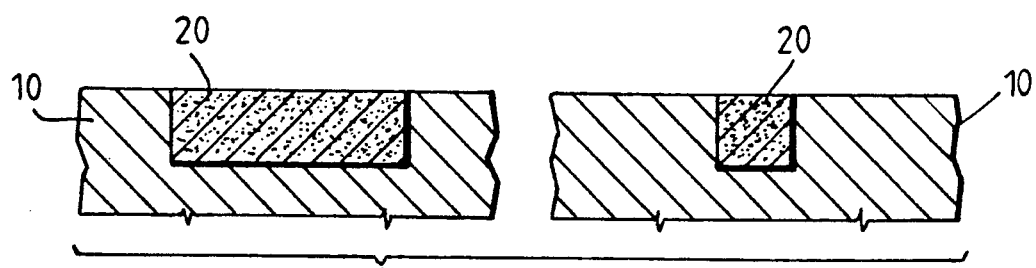
Figure 8:
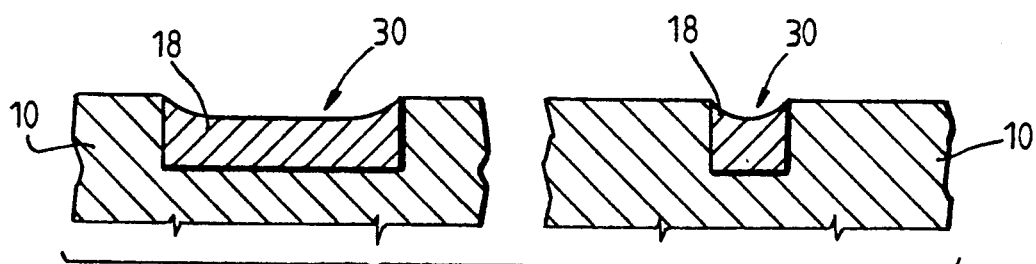
FIG. 8 is a cross-sectional view of an isolation trench arrangement that exemplifies the result of prior art planarization techniques.

In subsequent fabrication steps, as illustrated in FIG. 7, select locations of the sacrifical oxide layer 22 can be removed by chemical etching. In prior art processes exemplified in FIG. 8 where the field oxide layer 18 is made from undensified TEOS or even densified TEOS or BPTEOS, the field oxide layer is etched much more quickly (roughly 8 times faster for undensified TEOS and roughly 20% faster for densified TEOS) than the thermal oxide layer, thus resulting in field oxide depression 30 in the trench filled silicon dioxide 18. For example, using a buffered 10:1 HF etch, the etch rate of thermal oxide is about 5.9 Å/sec; for densified (phosphorous doped) LPCVD TEOS, the etch rate is about 6.9 Å/sec. With the present invention, the 10:1 HF etch rate of the hardened, nitrided TEOS field oxide 20 is 5.90 Å/sec. This is about a 20% reduction in the etch rate as compared to densified TEOS and is essentially the same rate as for the sacrificial thermal oxide layer. Thus, as shown in FIG. 7, the etch back of the sacrificial oxide layer and a thin layer of the hardened, nitrided field oxide will proceed at approximately the same rate, resulting in a planarized surface of the field oxide 20 even with the top surfaces of the silicon 10.

While the inventive system has been particularly shown and described with reference to these various embodiments, it will be recognized by those skilled in the art that modifications and changes may be made to the present invention described above without departing from the spirit and scope thereof, which is set forth in the following claims.

What is claimed is:

1. A method of selectively retarding the etch rate of field oxide without retarding the etch rate of sacrificial oxide layer in the fabrication of semiconductors devices, comprising:
   forming a field oxide layer on select locations of a semiconductor substrate surface;
   implanting nitrogen ions into the field oxide layer;
   thermally annealing the nitrided field oxide layer;
   forming a sacrificial oxide layer on the semiconductor substrate surface; and
   etching select areas of the sacrificial oxide layer.

2. The method of claim 1 wherein the semiconductor substrate is undoped or doped silicon.

3. The method of claim 1 wherein the field oxide is formed by local oxidation of silicon.

4. The method of claim 1 wherein the field oxide is formed in an isolation trench.

5. The method of claim 1 wherein the field oxide layer is formed by thermal oxidation.

6. The method of claim 1 wherein the field oxide layer is formed by chemical vapor deposition.

7. The method of claim 1 wherein the field oxide layer is formed by vapor deposition of silane or an organosilane.

8. The method of claim 1 wherein the field oxide layer is formed by vapor deposition of tetraethylorthosilane.

9. The method of claim 1 wherein the field oxide is densified.

10. The method of claim 1 wherein the nitrogen ions are implanted at a dose of about $10^{13}$ to about $10^{15}$ ions per cm$^2$.

11. The method of claim 1 wherein the nitrided field oxide layer is annealed at from about 800° to about 1100° C. for about one minute to about one hour.

12. The method of claim 1 wherein the sacrificial oxide is formed by thermal oxidation.

13. The method of claim 1 wherein the select locations of sacrificial oxide is etched with aqueous buffered HF.

14. For use in the fabrication of a semiconductor chip including an isolation trench formed in a semiconductor substrate, said trench having a top wall edge and a bottom and being adjacent to two sides having top surfaces thereon, a process of planarizing the isolation trench comprising the steps of:
   depositing a layer of silicon dioxide into the trench so as to fill the trench and form a silicon oxide layer even with the top surfaces of the sides;
   implanting nitrogen ions into silicon dioxide filled trench to form a nitrided silicon oxide layer;
   thermally annealing the nitrided silicon oxide layer;
   forming an oxide layer on the top surfaces of the semiconductor substrate; and
   etching back the oxide layer until the oxide layer is substantially removed from the top surfaces of the sides and until the nitided silicon oxide layer remains even with the top wall edge of the trench.

15. The process of claim 14 wherein the semiconductor substrate is undoped or doped silicon.

16. The process of claim 14 wherein the silicon dioxide layer is formed by chemical vapor deposition.

17. The process of claim 14 wherein the silicon dioxide layer is formed by vapor deposition of silane or an organosilane.

18. The process of claim 14 wherein the silicon dioxide layer is formed by vapor deposition of tetraethylorthosilane.

19. The process of claim 14 wherein the silicon dioxide is densified prior to implanting the nitrogen ions.

20. The process of claim 14 wherein the nitrogen ions are implanted at a dose of about $10^{13}$ to about $10^{15}$ ions per cm$^2$.

21. The process of claim 14 wherein the nitrided silicon oxide layer is annealed at from about 800° to about 1100° C. for about one minute to about one hour.

22. The process of claim 14 wherein the oxide layer is formed by thermal oxidation.

23. The process of claim 14 wherein the oxide layer is etched with aqueous buffered HF.

* * * * *